United States Patent [19]

Margadonna et al.

[11] Patent Number: 5,504,015
[45] Date of Patent: Apr. 2, 1996

[54] PROCESS FOR PREPARING PHOTOVOLTAIC MODULES BASED ON CRYSTALLINE SILICON

[75] Inventors: Daniele Margadonna, Ciampino; Valter Pasqua, Rome; Mariano Zarcone, Nettuno, all of Italy

[73] Assignee: Eurosolare S.p.A., Milan, Italy

[21] Appl. No.: 309,087

[22] Filed: Sep. 20, 1994

[30] Foreign Application Priority Data

Sep. 23, 1993 [IT] Italy .................................. MI93A2035

[51] Int. Cl.⁶ .................................................... H01L 31/18
[52] U.S. Cl. .................. 437/2; 136/244; 136/251; 136/258; 437/51; 437/205; 437/207
[58] Field of Search ........................ 136/244, 251, 136/256, 258 PC, 261; 437/2–5, 51, 205, 207

[56] References Cited

U.S. PATENT DOCUMENTS

| | | | |
|---|---|---|---|
| 4,062,102 | 12/1977 | Lawrence et al. | 437/2 |
| 4,184,903 | 1/1980 | Dillard et al. | 156/104 |
| 4,234,351 | 11/1980 | Deminet et al. | 136/251 |
| 4,270,263 | 6/1981 | Johnson et al. | 437/51 |
| 4,283,590 | 8/1981 | Bilger et al. | 136/251 |
| 4,377,901 | 3/1983 | David et al. | 437/2 |
| 4,806,495 | 2/1989 | Levine et al. | 437/2 |
| 5,028,546 | 7/1991 | Hotchkiss | 437/2 |

FOREIGN PATENT DOCUMENTS 2481522 10/1981 France.

OTHER PUBLICATIONS

Conference Record of the Fourteenth IEEE Photovoltaic Specialists Converence—Jan. 7–10, 1980 *Silicon Solar Cells With Screen Printed Diffusion And Metallization* by L. Frisson, M. Honore, R. Mertens, R. Govaerts, and R. Van Overstraeten. pp. 941 & 942.

Primary Examiner—Aaron Weisstuch
Attorney, Agent, or Firm—Oblon, Spivak, McClelland, Maier & Neustadt

[57] ABSTRACT

A process for preparing low-cost photovoltaic modules based on crystalline silicon. The silicon wafers are treated while supported on a substrate having properties compatible with the process.

6 Claims, 2 Drawing Sheets

PROCESS FOR PREPARING PHOTOVOLTAIC MODULES BASED ON CRYSTALLINE SILICON

BACKGROUND OF THE INVENTION

Field of the Invention

This invention relates to a process for preparing photovoltaic modules based on thin crystalline silicon.

DESCRIPTION OF THE RELATED ART

Photovoltaic modules based on crystalline silicon have been produced for some time and are used to generate electrical energy. In currently used production methods, as described for example by Martin A. Green in "Solar Cells, Operating Principles, Technology and System Applications" Prentice-Hall Inc. N.J., the modules consist of individual solar cells bonded together to form an assembly of cells electrically connected together in series or parallel. This assembly is then encapsulated between a high transmittance glass sheet and a further sheet of glass or suitable plastic material as rear protection. The entire unit is then sealed with a polymer resin.

These processes use silicon wafers having a thickness exceeding 350–500 μm.

Process evaluation indicates that a considerable decrease in the cost per watt can be achieved by reducing the thickness and hence the quantity of silicon. The problem is that the fragility of the material increases as the thickness decreases and the area increases, and in addition the photovoltaic module process production yield falls drastically when the wafer thickness falls below 300 μm.

SUMMARY OF THE INVENTION

The present invention solves these problems through a low-cost production process for photovoltaic modules in which thin large-area wafers of silicon are involved.

In accordance therewith the present invention provides a process for preparing photovoltaic modules based on mono and polycrystalline silicon, characterized in that the silicon is in the form of a supported large-area thin layer, the process comprising the following steps:

a) placing one or more silicon wafers of surface area up to 0.5 m$^2$ and thickness between 100 and 500 μm doped with suitable electrically active impurities, on a support substrate consisting of a heat-resistant material;

b) depositing a dopant containing paste on the silicon wafers by a silk screen process;

c) diffusing the dopant by heating to a temperature of between 900° and 1000° C.;

d) defining the surface area of the unit photo active elements by cutting the diffused layer;

e) forming contacts on the front and rear surfaces of the photo active elements;

f) forming contacts on and applying a rear protection glass;

g) interconnecting the photo active elements;

h) depositing an anti-reflecting layer; and i) encapsulating the interconnected elements.

The process is described hereinafter with reference to the accompanying figures, in which equivalent elements correspond to identical reference numerals.

Figure 1:
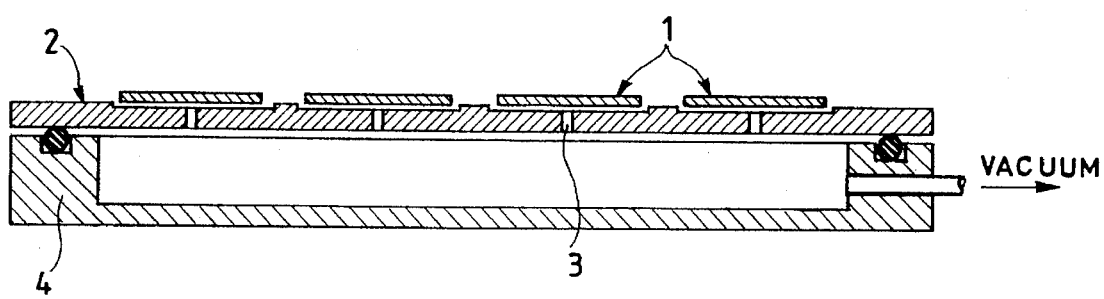
FIG. 1 illustrates an assembly formed by Steps (a)–(c) according to the present invention.

DETAILED DESCRIPTION OF THE PREFERRED EMBODIMENTS (1) In step a), shown in FIG. 1, mono or polycrystalline silicon wafers are used, obtained by cutting p or n doped hyperpure silicon ingots. The wafer thickness is between 100 and 500 μm, 100 μm being preferred. Their area can be varied as desired. After cleaning using ultrasound or one of the various known detergent solutions used in such cases, the wafers 1 are placed on a support substrate 2 consisting of sintered amorphous quartz or another material resistant to the high temperature of process step c).

The support substrate comprises recesses for receiving the silicon wafers 1 and is provided with through holes 3, the recess depth being less than the wafer thickness. The support substrate 2 is placed (to adhere via a gasket) on an evacuable metal support 4 through which vacuum can be applied to the recesses. In this manner, the wafers 1 are kept adhered to the support 2 by a pneumatic vacuum system. (2) Step b). The metal support 4 plus the support substrate 2 containing the silicon wafers 1 is placed, while maintaining the whole assembly under vacuum, in a commercial apparatus able to deposit on the silicon wafers a silk screen paste containing a doping agent of opposite conductivity type to that of the silicon wafer 1.

(3) Step c). The doping agent is diffused in a tunnel furnace with a high temperature thermal cycle enabling the doping agent to diffuse into the silicon with a suitable concentration profile The temperature exceeds 900° C., 950° C. being preferred.

(4) Step d). The support substrate 2 with the silicon wafers thereon, located on the metal support 4 and maintained under vacuum, is placed on a traverser table with micrometric x-y movements. Using preferably a power laser, or alternatively a diamond grinding wheel or other suitable implement, the diffused layer (short-circuiting the device) is removed from the edges of the silicon wafer. It is also possible, particularly in the case of large-area wafers, to use this method for dividing the overall surface of the silicon wafer into different independent photo active elements. These elements, prepared from a single silicon wafer, are then electrically connected together in the subsequent stages of the process to form a photovoltaic module.

Figure 2:
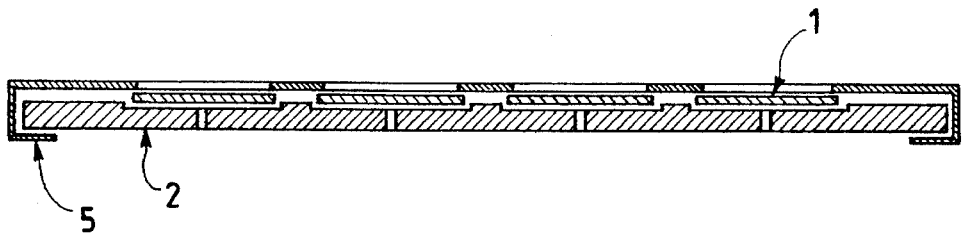
FIG. 2 illustrates the assembly formed in Step (d) of the present invention.

At the end of this step, as the procedure for diffusing the doping agent in the furnace will have formed an insulating silicon oxide layer on the surface of the wafers, it is opportune to remove it with hydrofluoric acid. For this purpose, as can be seen from FIG. 2, the support substrate 2 with the wafers thereon is inserted into a masking cover 5 consisting of a "pocket" of acid resistant material such as Teflon, with apertures corresponding with the part to undergo chemical attack. During chemical attack, it may be advantageous to enhance the action with ultrasound. The wafers are then washed with deionized water and dried. This removal procedure can be avoided if during the next stage a firing cycle is used such that the metal can penetrate the oxide layer so that the metal is able to alloy with the silicon.

(5) Step e). The support substrate 2 with the wafers 1 thereon is again placed on the evacuable metal support 4 and the front contacts are deposited on the various photo active elements by a silk screen process, preferably using silver-based conducting paste.

Figure 3:
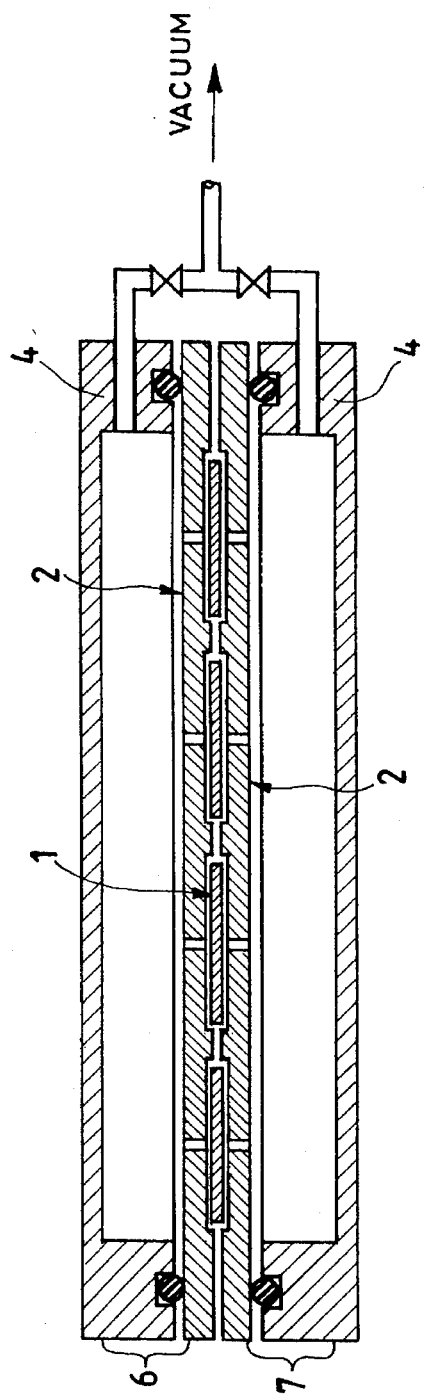
FIG. 3 illustrates an assembly formed in Steps (e) and (f) of the present invention.

To form the rear contacts an inverting system is required as shown schematically in FIG. 3. The support substrate 2 placed on the metal support 4 and kept under vacuum is positioned inverted (transferring system 6) on a perfectly identical system (receiving system 7). On removing the vacuum from the transferring system 6 the photo active elements fall by gravity into the recesses of the receiving system 7, to which vacuum is now applied. The inverted photo active elements now expose their rear surface for silk screen deposition of the rear contacts. After drying, the contacts are fired at high temperature, between 700° and 900° C., preferably 800° C., so that they alloy with the silicon to form ohmic contact therewith.

(6) Step f). Conducting tracks are deposited on a glass sheet of about 3 mm thickness and of dimensions equal to or greater than those of the silicon wafer (if this is divided into several photo sensitive elements) or of a number of wafers (if each of these represents one photo sensitive element), in positions exactly corresponding to the rear contacts already deposited in the preceding stage on the rear of the silicon wafer, in order to connect the sensitive elements together. The glass sheet is superposed on the silicon wafers such that the two series of contacts are juxtaposed. At this point the vacuum is released and the "sandwich" is heated to about 200° C.

(7) Step g). Interconnections are formed such that the front of one photo sensitive element is connected to the rear of the next to provide the required current and voltage at the module output.

Figure 4:
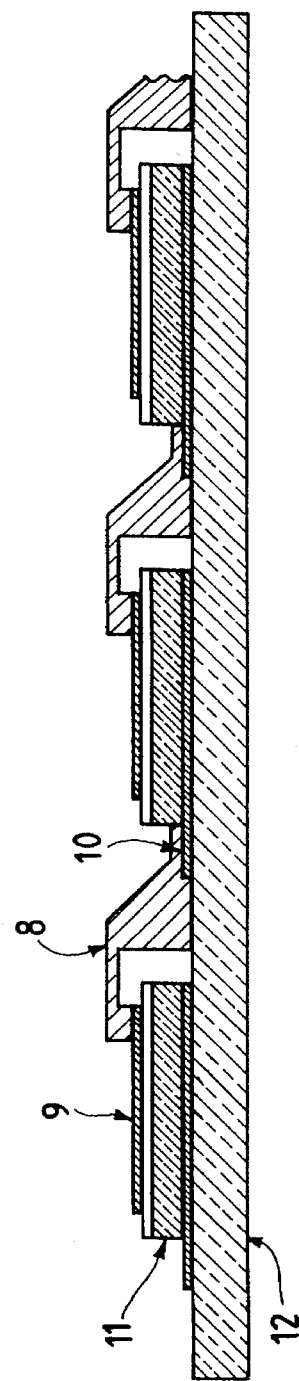
FIG. 4 illustrates an assembly formed in Steps (g)–(i) of the present invention.

FIG. 4 represents an interconnection scheme. A layer of insulating polymer is firstly deposited on one edge of the cell, then by means of a conductive deposit 8 the front contact 9 of a cell is connected to the next cell rear contact 10 which is extended along the glass to pass beyond the cell at the point protected by the insulating layer. This prevents short-circuiting of the cell. FIG. 4 also shows the position of the p/n junction 11 and the rear glass 12.

(8) Step h). An anti-reflecting layer is formed on the front of the module. For this purpose, a layer of a few hundred angstroms of titanium oxide can be deposited, for example.

(9) Step i). The module is now encapsulated using one of the many known methods. For example, a high transmittance toughened glass plate can be used as front protection and ethylene vinyl acetate as the sealing resin.

In another embodiment of the invention, a single contact firing step can be used for both the rear contacts on the silicon wafer and the contacts on the rear protection glass. In this respect, although the silicon firing temperature is very high and basically incompatible with the glass, optimum conditions for this procedure can be achieved by making the firing times very short (of the order of a few seconds) and by effecting the heating by irradiating the silicon surface. Moreover, the glass does not absorb radiation in that region of the spectrum.

In this case, the process is modified in the following manner. In step e), after depositing the rear contact, there is no high temperature firing but instead there is heating to a temperature of between 200° and 300° C. Then in step f) high temperature firing is effected at around 700°–900° C. for a time of between 5 and 20 seconds.

In a further embodiment of the present invention, in step f) the contacts are not formed on the glass but instead are formed on the support substrate 2, which hence becomes a constituent element of the photovoltaic module.

Summarizing, the process for producing modules in accordance with this invention does not start from small-area wafers but instead from supported large-area silicon sheets. The module is considered to be a series of silicon sheets having different thickness, stratified and interconnected by silk screen processes.

The modules produced by this process have a solar conversion efficiency of not less than that obtained from modules produced by traditional processes. In addition, because of the reduction in the silicon sheet thickness and the effect of the increased production rate achieved by handling large areas up to 0.5 m$^2$, resulting in a reduction in production time by a factor of about 10, it is estimated that the industrial production costs per shift are halved for volumes exceeding 10 Mw per year.

The following examples are given for a better understanding of the invention and must not be conceived as limitative thereof.

EXAMPLE 1

Eight wafers 1 of ultrapure p-doped silicon, of 200 μm thickness and dimensions 20×20 cm, are placed on a support substrate 2 consisting of a sintered quartz plate comprising eight recesses for holding the wafers. The recesses have a depth of 150 μm and comprise one or more through holes 3 in their base.

The plate 2 is placed on an evacuable rectangular metal tray 4 provided with a rubber seal gasket. When vacuum is applied to the assembly the wafers 1 are maintained secured to the quartz plate 2. A doping paste containing phosphorus is now deposited by a silk screen process on the wafers.

The quartz plate is then separated from the evacuable tray and inserted in a tunnel kiln where diffusion takes place over a time of 20 minutes, a maximum temperature of 950° C. being reached. At the end of the diffusion procedure, on the wafer surface there is a layer n-doped with phosphorus to a depth of 0.2–0.4 μm.

The plate 2 is now relocated on the evacuable tray 4 and maintained under vacuum. Using an x-y table and a power laser, the wafers 1 are cut so that four photo active elements are obtained from each wafer. The diffused layer is also removed from the edges. In this manner a total of 32 photo active units each of about 100 cm$^2$ are obtained. The silicon oxide which forms on the surface as a result of the diffusion is removed by HF using the device described above.

The plate 2 is repositioned on the evacuable tray 4 and the front contacts 9 are deposited on the silicon by a silk screen process. The contacts 10, formed from Ag, have a thickness of 10 μm and a width of 120 μm. The contacts 10 formed from Ag and Al on the rear are deposited in a like manner after inverting the plate as described above. Both the front and rear contacts (9, 10) are dried at 200° C. and both are then alloyed with the silicon by firing at 750° C.

Conducting tracks are now silk-screen deposited on a toughened glass sheet 12 of 3 mm thickness and of dimensions equal to those of the quartz plate, to exactly correspond with the rear contacts 10 already deposited on the rear of the wafers. After firing at a temperature compatible with the glass (400° C. in our case) the glass plate 12 is superposed so that the contacts on the glass become juxtaposed with those already silk-screen deposited on the silicon.

After making the interconnections between the front of one photo active element and the rear of the next, an 800 Å layer of titanium oxide is vapor-phase deposited on the front part.

The module is now encapsulated in the usual manner.

EXAMPLE 2

The procedure of Example 1 is followed on 20×10 cm silicon sheets as far as the deposition of the rear contacts. At this point, instead of firing at high temperature, the contacts are dried at 200° C. in an oven for a few minutes.

The contacts are now formed on the rear glass as described in Example 1, but with the difference that instead of firing at 400° C., firing is effected at 750° C. for 15 seconds.

The final part of the module forming process is as described in Example 1.

We claim:

1. A method of preparing photovoltaic modules based on mono and polycrystalline silicon, wherein the silicon is in the form of a supported large-area thin layer, said method comprising the steps of:

a) placing at least one silicon wafer having a surface area less than or equal to 0.5 m$^2$ and a thickness between 100 and 500 μm and doped with electrically active impurities, on a support substrate consisting of a heat-resistant material and having at least one recess each comprising at least one hole which passes through said support substrate;

(a-1) adhering said support substrate to an evacuable support via a gasket;

(a-2) adhering said at least one silicon wafer to said support substrate by applying vacuum to said at least one recess through said evacuable support;

b) depositing a dopant containing paste on said at least one silicon wafer via a silk screen process;

c) diffusing the dopant by heating said support substrate and said at least one silicon wafer to a temperature between 900° and 1000° C., to thereby create a diffused layer;

d) defining the surface areas of a plurality of unit photo active elements by cutting said diffused layer;

e) forming contacts on the front and rear of each unit photo active element;

f) forming contacts on a rear protection glass and applying the rear protection glass to the rear of said active elements;

(f-1) releasing the vacuum from said evacuable support;

g) interconnecting the photo active elements;

h) depositing an anti-reflecting layer on the front of the photo voltaic module; and i) encapsulating said photo voltaic module.

2. A method according to claim 1, wherein said silicon wafers have a thickness between 100 and 250 μm.

3. A method according to claim 1, wherein said silicon wafers have a thickness of 100 μm.

4. A method according to claim 1, wherein said support substrate is formed of quartz.

5. A method according to claim 1, wherein said support substrate acts as said rear protection glass.

6. A method according to any one of claims 1 to 5 wherein in said step e), after rear contact deposition, heating of said active elements is effected to a temperature between 200° and 300° C., and in step f) firing is effected at a temperature between 700° and 800° C. for less than 20 seconds.

* * * * *